United States Patent
Carr et al.

(10) Patent No.: US 12,066,483 B2
(45) Date of Patent: Aug. 20, 2024

(54) METHOD FOR TESTING AN INTEGRATED CIRCUIT (IC) DEVICE AT A TESTING TEMPERATURE

(71) Applicant: TEXAS INSTRUMENTS INCORPORATED, Dallas, TX (US)

(72) Inventors: Genesis Benjamin Carr, Frisco, TX (US); Vijian Techanamurthy, Plano, TX (US); Vasantkumar Prabhuda Trambadiya, Carrollton, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 56 days.

(21) Appl. No.: 17/985,617

(22) Filed: Nov. 11, 2022

(65) Prior Publication Data

US 2024/0159821 A1    May 16, 2024

(51) Int. Cl.
*G01R 31/28*    (2006.01)

(52) U.S. Cl.
CPC ................. *G01R 31/2874* (2013.01)

(58) Field of Classification Search
CPC ..... H01L 2924/14; H01L 22/14; H01L 22/34; H01L 2924/1305; G01R 31/28; G01R 31/31915; G01R 31/44; G01R 31/52; G06F 30/367; G06F 2119/06
See application file for complete search history.

(56) References Cited

U.S. PATENT DOCUMENTS

| 4,588,945 | A * | 5/1986 | Groves | G01R 31/31915 |
| | | | | 324/73.1 |
| 6,008,593 | A * | 12/1999 | Ribarich | H05B 41/3925 |
| | | | | 315/307 |
| 7,412,346 | B2 * | 8/2008 | Bashir | G01R 31/2874 |
| | | | | 702/132 |
| 7,519,880 | B1 * | 4/2009 | Johnson | G01R 31/2874 |
| | | | | 714/724 |
| 9,291,667 | B2 * | 3/2016 | Armstrong | G05D 23/1919 |
| 9,562,943 | B2 * | 2/2017 | Chuang | G01R 31/2874 |
| 9,841,459 | B2 * | 12/2017 | Ho | G01R 31/2874 |

* cited by examiner

*Primary Examiner* — Vinh P Nguyen
(74) *Attorney, Agent, or Firm* — Ronald O. Neerings; Frank D. Cimino

(57) ABSTRACT

One example includes a method for testing an IC device at a testing temperature. The method includes fabricating the IC device based on a circuit design. The IC device includes a power transistor, conductive I/O leads, a temperature test switch system coupled between the conductive I/O leads, and a thermal diode coupled to the temperature test switch system. The method also includes coupling the conductive I/O leads of the IC device to a circuit test fixture and activating the power transistor to conduct a current in the IC device via the circuit test fixture. The method also includes periodically measuring a temperature of the IC device by measuring a voltage across the thermal diode via the conductive I/O leads based on the temperature test switch system until achieving the testing temperature. The method further includes performing functional measurements associated with the IC device at the testing temperature.

20 Claims, 6 Drawing Sheets

METHOD FOR TESTING AN INTEGRATED CIRCUIT (IC) DEVICE AT A TESTING TEMPERATURE

TECHNICAL FIELD

This description relates generally to electronic test systems, and more particularly to a method for testing an IC device at a testing temperature.

BACKGROUND

Integrated circuit (IC) devices can be fabricated for a variety of reasons. Many IC devices are tested under certain operational conditions, such as based on expected operational limits or conditions associated with normal operation. For example, many IC devices can be tested at a specific temperature to ensure sufficient operational parameters at extreme temperatures. As one example, some IC devices can be tested at Automotive Grade 0 temperatures to ensure sufficient operation at higher temperatures (e.g., 175° C.). However, some testing equipment can have limitations as to the temperature at which tests can be performed. For example, some testing handlers can only achieve a temperature that is less than the desired testing temperature. Furthermore, ambient temperature controllers may be unable to ascertain a true temperature of an IC device die based on heat-sinking provided by IC device handling equipment. Therefore, despite an IC device handler providing a given ambient temperature, the temperature of the IC device die may be less than the given ambient temperature based on unintended heat sinks of surrounding devices or handler equipment, and it may be difficult to ascertain the true temperature of the IC device.

SUMMARY

One example includes a method for testing an IC device at a testing temperature. The method includes fabricating the IC device based on a circuit design. The fabricated IC device includes a power transistor, conductive I/O leads, a temperature test switch system coupled between the conductive I/O leads, and a thermal diode coupled to the temperature test switch system. The method also includes coupling the conductive I/O leads of the fabricated IC device to a circuit test fixture and activating the power transistor to conduct a current in the fabricated IC device via the circuit test fixture. The method also includes periodically measuring a temperature of the fabricated IC device by measuring a voltage across the thermal diode via the conductive I/O leads based on the temperature test switch system until achieving the testing temperature. The method further includes performing functional measurements associated with the fabricated IC device at the testing temperature.

Another example described herein includes an IC device. The IC device includes functional circuitry comprising a power transistor, a first conductive I/O lead, and a second conductive I/O lead. The IC device also includes a temperature test switch system comprising a set of switches coupled to the functional circuitry and to the first and second conductive I/O leads and a control register that is adapted to be coupled to automated testing equipment (ATE) to control the set of switches between the normal operating mode and a test mode. The IC device further includes a thermal diode coupled to the temperature test switch system, such that the thermal diode is coupled to the first and second conductive I/O leads in the test mode.

Another example described herein includes a test fixture system for testing an IC device at a testing temperature. The system includes automated testing equipment (ATE) configured to communicate with a control register of the fabricated IC device to control a set of switches of a temperature test switch system of the fabricated IC device from a normal operating mode to a test mode and to activate a power transistor associated with the fabricated IC device to conduct a current in the fabricated IC device. The system further includes a testing controller adapted to be coupled to a first conductive I/O lead of the fabricated IC device and configured to provide a test current to a thermal diode of the fabricated IC device. The testing controller is also adapted to be coupled to a second conductive I/O lead of the fabricated IC device to measure a voltage across the thermal diode to periodically measure a temperature of the fabricated IC device until achieving the testing temperature. The testing controller can further be configured to perform functional measurements associated with the fabricated IC device at the testing temperature.

DETAILED DESCRIPTION

Figure 1:
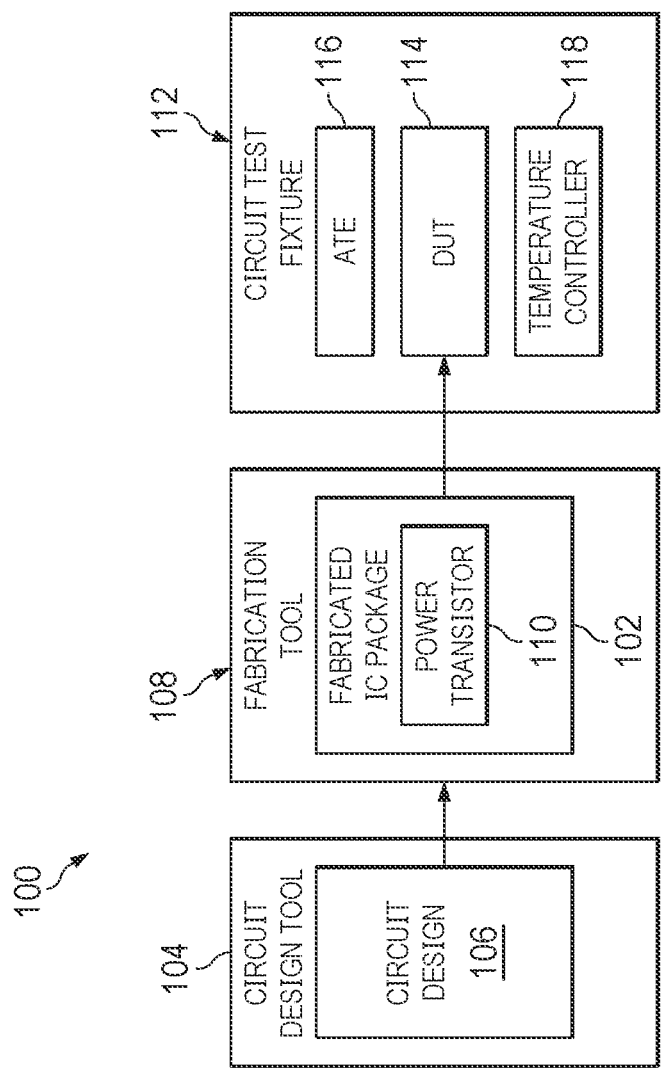
FIG. 1 is an example block diagram of testing an integrated circuit (IC) device at a testing temperature.

This description relates generally to electronic systems and, more particularly, to a method for testing an IC device at a testing temperature. An integrated circuit (IC) device that includes functional circuitry can be fabricated. As an example, the functional circuitry can include a power transistor. The IC device can also include input/output conductive (I/O) leads, a control register, a thermal diode, and a temperature test switch system. After fabrication of the IC device, the conductive I/O leads can be coupled to a circuit test fixture for testing. As an example, each of a first and second conductive I/O lead of the conductive I/O leads can be coupled to the functional circuitry in a normal operating mode based on the temperature test switch system. However, in a test mode, the first and second conductive I/O leads can be coupled to the thermal diode based on the temperature test switch system.

For example, the circuit test fixture can include automated test equipment (ATE) that can be communicatively coupled with the control register of the IC device. As an example, the temperature test switch system can include a set of switches that couple to the first and second conductive I/O leads. Thus, the ATE can be configured to set the switches between the normal operating mode and the test mode. The circuit testing fixture can thus perform tests on the IC device at a desired testing temperature. For example, the circuit test fixture can include a temperature controller that can be configured to provide an ambient handler temperature. However, the desired testing temperature can be greater than the maximum handler temperature that can be achieved by the circuit test fixture. Furthermore, the IC handling equipment and portions of the IC device (e.g., I/O pins, packaging material, etc.) can operate as heat sinks that can reduce the ambient temperature as provided to the IC die, thus rendering it difficult to determine an actual temperature of the IC device.

To test the IC device at the desired testing temperature (e.g., during the package testing and/or validation stage), the circuit test fixture can first determine a nominal temperature of the IC device. As described herein, determination of temperature of the IC device is a determination of the temperature of the IC die (e.g., the silicon structure of the IC device). Therefore, the determination of the temperature is based on an actual temperature of the IC device, as opposed to a determination of the ambient temperature of the environment in which the IC device resides. The circuit test fixture can include a testing controller that is configured to provide a test current to the first conductive I/O lead. The test current can thus flow through the thermal diode in the test mode, such that the testing controller can determine a voltage across the thermal diode via the second conductive I/O lead. The test current and the voltage across the thermal diode can thus be determinative of the nominal temperature of the IC device.

Upon determining the nominal temperature of the IC device, the circuit test fixture can activate the power transistor to conduct a current (e.g., at full load). For example, the ATE can be configured to activate the power transistor via the control register of the IC device. While the power transistor is activated, the testing controller can periodically determine the temperature of the IC device. For example, at each temperature determination, the testing controller can periodically provide the test current through the thermal diode and measure the voltage across the thermal diode responsive to the test current. Upon determining that the IC device achieves the testing temperature, the circuit test fixture can perform functional measurements associated with the IC device at the testing temperature, thereby validating functional requirements at the desired testing temperature. As described herein, the term "perform functional measurements" refers to measuring operational parameters that correspond to the intended function(s) of the IC device. As a result, as described herein, the IC device can be tested at a true desired testing temperature of the IC device, as opposed to testing based on an extrapolation of temperature of the IC device or based on an approximation of the testing temperature based on ambient conditions, as is provided in conventional testing.

FIG. 1 is an example diagram 100 of testing an integrated circuit (IC) device at a testing temperature. The diagram 100 is demonstrated as including functional blocks that are representative of the steps and flow of how the IC device, demonstrated at 102, is fabricated and tested during a test mode, such as to facilitate functional testing of the IC device 102 at a desired testing temperature. For example, the IC device 102, as described herein, can be tested at a desired temperature corresponding to an Automotive Grade 0 temperature to ensure sufficient operation at higher temperatures.

The diagram 100 includes a circuit design tool 104 that is configured to facilitate design of the IC device 102 by a user. The circuit design tool 104 is thus configured to generate a circuit design 106 that corresponds to the design of the IC device 102. The circuit design tool 104 can correspond to a software program or a computer terminal on which the user can provide inputs to generate the circuit design 106. As an example, the circuit design 106 can be provided as a software file or set of files that describe the physical layout and/or operational characteristics of the IC device 102.

The diagram 100 also includes a fabrication tool 108 that is configured to receive the circuit design 106 and to fabricate the IC device 102. As an example, the fabrication tool 108 can be any of a variety of fabrication tools that can fabricate ICs. The fabricated IC device 102 includes functional circuitry that includes a power transistor 110 that is configured to be periodically activated to conduct current through a load, such as operating as a low dropout (LDO) power regulator or a switching power regulator. The IC device 102 can also include conductive I/O leads, a control register, a thermal diode, and a temperature test switch system, as described in greater detail herein. As described herein, the IC device 102 can correspond to an IC package that includes an IC die. Thus, the conductive I/O leads can correspond to conductive pads that are conductively coupled to pins of the associated IC package.

The diagram 100 also includes a circuit test fixture 112 that can correspond to any of a variety of circuit testing devices that can probe and measure the conductive I/O leads of the fabricated IC device 102. In the example of FIG. 1, the fabricated IC device 102 is provided as a device-under-test (DUT) 114 to the circuit test fixture 112, such that the conductive I/O leads of the fabricated IC device 102 can be coupled to the conductive probes of the circuit test fixture 112. As described herein, the DUT 114 and the fabricated IC device 102 are described interchangeably. The circuit test fixture 112 can thus provide electrical signals to the DUT 114 to monitor voltages and currents at the conductive I/O leads of the DUT 114 to determine the measurable parameters of the fabricated IC device 102. For example, the coupling of the fabricated IC device 102 to the circuit test fixture 112 can occur after packaging the IC circuit, such that the fabricated IC device 102 is an IC package that is coupled to the circuit test fixture 112. In the example of FIG. 1, the circuit test fixture 112 also includes automated test equipment (ATE) 116 that can communicate with a control register of the DUT 114 to switch the DUT 114 between a normal operating mode and a test mode.

As described herein, the circuit test fixture 112 can be configured to perform functional measurements of the DUT 114 at the desired testing temperature (e.g., at Automotive Grade 0 temperatures or above, such as 175° C.). However, the desired testing temperature can be greater than a maximum handler temperature that can be achieved by the circuit test fixture 112 (e.g., approximately 150° C.). Furthermore, the IC handling equipment of the circuit test fixture 112 and portions of the DUT 114 (e.g., I/O pins, packaging material, etc.) can operate as heat sinks that can reduce the ambient handler temperature provided by the IC handling equipment to the IC die of the DUT 114. Therefore, it may be difficult to determine an actual internal temperature of the DUT 114.

To perform the functional measurements of the DUT 114 at the desired testing temperature, the circuit test fixture 112 can first determine a nominal internal temperature of the DUT 114, and can subsequently internally heat the DUT 114 to the desired testing temperature to facilitate performance of the function measurements of the DUT 114 at the testing temperature. For example, the ATE 116 can switch the DUT 114 to the test mode to measure an internal temperature of the DUT 114. For example, the ATE 116 can provide switching signals to the temperature test switch system of the DUT 114 to couple a set of the conductive I/O leads to the thermal diode. The circuit test fixture 112 can thus provide a test current to the thermal diode and can measure a voltage across the thermal diode. The circuit test fixture 112 can thus calculate a nominal internal temperature of the DUT 114 based on the measured voltage across the thermal diode, as described in greater detail herein. While the techniques for measuring temperature are described herein based on the measuring a voltage across the thermal diode in response to a test current, other techniques for measuring the temperature can be implemented instead (e.g., a single point diode measurement). Therefore, measuring the temperature based on the thermal diode is but one example.

Upon measuring the nominal internal temperature of the DUT 114, the circuit test fixture 112 can internally heat the DUT 114 to the desired testing temperature to facilitate performance of the function measurements of the DUT 114 at the testing temperature. In the example of FIG. 1, the circuit test fixture 112 includes a temperature controller 118 that can correspond to a heating device for providing heat to the IC handling components of the circuit test fixture 112. However, as described above, the maximum temperature (ambient or of metal handling components) that can be achieved by the temperature controller 118 can be less than the desired testing temperature. As an example, the temperature controller 118 can provide the maximum temperature during the test mode (before or after the calculation of the nominal internal temperature of the DUT 114) to heat the DUT 114 as much as possible to minimize a time of additional heating.

To heat the internal temperature of the DUT 114 greater than the maximum temperature provided by the temperature controller 118, the ATE 116 can activate the power transistor 110 of the DUT 114 (e.g., at full load), such that the current flowing through the power transistor 110 can further heat the silicon of the DUT 114. While the power transistor 110 is activated and the internal temperature of the DUT 114 is increasing, the circuit test fixture 112 can periodically measure the internal temperature of the DUT 114, as described above. Therefore, the circuit test fixture 112 can determine when the DUT 114 achieves an internal temperature that is approximately equal to the desired testing temperature. In response to determining that the internal temperature of the DUT 114 is approximately equal to the desired testing temperature, the ATE 116 can deactivate the power transistor 110 of the DUT 114, and the circuit test fixture 112 can perform the functional measurements of the DUT 114 at the desired testing temperature. Accordingly, the functional operation of the DUT 114 can be accurately tested and validated at the desired testing temperature.

Figure 2:
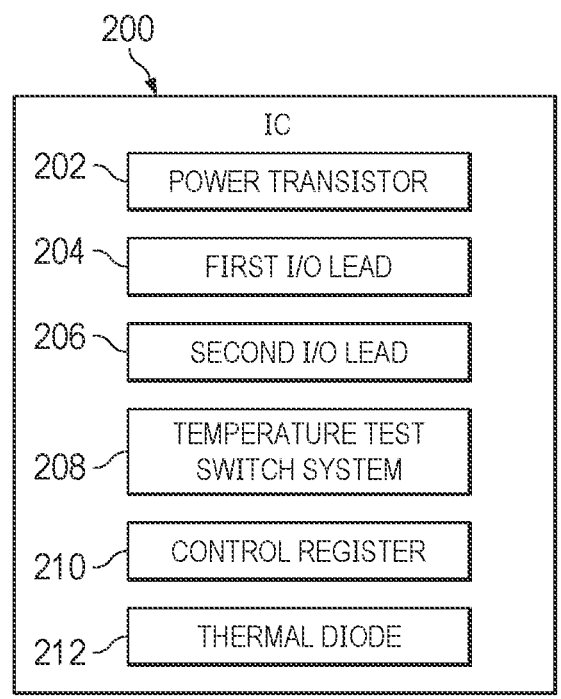
FIG. 2 is an example block diagram of an IC device.

FIG. 2 is an example block diagram of an IC device 200. The IC device 200 can correspond to the IC device 102/DUT 114 in the example of FIG. 1. Therefore, reference is to be made to the example of FIG. 1 in the following description of the example of FIG. 2.

The IC device 200 includes a power transistor 202 that can be part of the functional circuitry of the IC device 200, and thus part of the componentry that implements the intended functions of the IC device 200. The IC device 200 also includes a first conductive I/O lead 204 and a second conductive I/O lead 206. During a normal operating mode, the first and second conductive I/O leads 204 and 206 can be coupled to the functional circuitry of the IC device 200, and can thus be implemented for any of a variety of I/O purposes of the IC device 200.

The IC device 102 also includes a temperature test switch system 208, a control register 210, and a thermal diode 212. The temperature test switch system 208 can be fabricated as part of the IC device 200 to facilitate switching between the normal operating mode and the test mode, as described herein. The control register 210 can be implemented to switch the temperature test switch system 208 between the test mode and the normal operating mode via the ATE 116 of the circuit test fixture 112. Therefore, in the test mode, the circuit test fixture 112 can measure the internal temperature of the IC device 200 via the first and second conductive I/O leads 204 and 206 and the thermal diode 212, as described herein.

As an example, the temperature test switch system 208 can include a set of switches that can be controlled to set the IC device 200 between the test mode or the normal operating mode, such as in response to the ATE 116 of the circuit test fixture 112. As described herein, the description of switching the IC device 200 between the test mode and the normal operating mode and switching the temperature test switch system 208 between the test mode and the normal operating mode are interchangeable. Thus, as described above in the example of FIG. 1, in response to the first and second conductive I/O leads 204 and 206 being coupled to the circuit test fixture 112, the ATE 116 can switch the temperature test switch system 208 to the test mode.

In the test mode, a first switch of the temperature test switch system 208 can decouple the functional circuitry and the first conductive I/O lead 204 and can couple the first conductive I/O lead 204 to the thermal diode 212. Similarly, a second switch of the temperature test switch system 208 can decouple the functional circuitry and the second conductive I/O lead 206 and can couple the second conductive I/O lead 204 to the thermal diode 212. The circuit test fixture 112 can thus provide a test current through the thermal diode 212 via the first conductive I/O lead 204 to facilitate measurement of a voltage across the thermal diode 212 via the second conductive I/O lead 206. By providing a single ended measurement of the of the temperature via the second conductive I/O lead 206 separate from the first conductive I/O lead 204 on which the test current is provided, the temperature can be obtained as a full Kelvin measurement while mitigating series resistance in the signal path. Accordingly, the circuit test fixture 112 can measure the internal temperature of the IC device 200 based on the voltage across the thermal diode 212, such as both initially to determine a nominal internal temperature and periodically to determine that the internal temperature of the IC device 200 achieves the desired testing temperature.

For example, the internal temperature of the IC device 200 can be calculated based on the single point diode equation, as follows:

$$I = I_S \left( e^{\left(\frac{V_D}{n\left[\frac{kT}{q}\right]}\right)} - 1 \right) \qquad \text{Equation 1}$$

Where: I is the test current;

q and k are the elementary charge and Boltzmann constant, respectively;

$I_S$ a process dependent current through the thermal diode 212;

n is a process dependent ideality factor of the thermal diode 212;

$V_D$ is the measured voltage across the thermal diode 212; and

T is the temperature of the thermal diode 212.

The thermal diode 212 can also be subject to series resistance (e.g., based on non Kelvin measurement). Therefore, manipulating Equation 1 to solve for temperature T results in the following equation:

$$T = (V_D - IR) \frac{q}{nk} \frac{1}{\ln\left(\frac{I+I_S}{I_S}\right)} \quad \text{Equation 2}$$

Where: R is the series resistance of the thermal diode 212.

The temperature T can thus be estimated based on a single point measurement using Equation 2. However, by implementing a three variable set of equations based on Equation 2, variables can be canceled to facilitate an accurate calculation of the temperature T. The three variable set of equations can be based on varying the test current ID (e.g., $I_{D1}$, $I_{D2}$, and $I_{D3}$) and measuring three respective voltages ($V_{D1}$, $V_{D2}$, and $V_{D3}$) across the thermal diode 212. As a result, the process dependent current $I_S$ and the series resistance R can be canceled.

Cancellation of the process dependent current $I_S$ and the series resistance R leaves the ideality factor n as the only remaining unknown source of error. As an example, the ideality factor n can be characterized by depositing the wafer that includes the IC die of the IC device 200 in a known temperature environment, such as an oven, oil bath, or prober. Therefore, the ideality factor n can be determined based on a similar three variable equation, as follows:

$$n = \frac{q}{Tk}\left\{\frac{(ID3-ID1)(VD3-VD2)-(ID3-ID2)(VD3-VD1)}{(ID3-ID1)\ln(ID3-ID1)-(ID3-ID2)\ln(ID3-ID1)}\right\} \quad \text{Equation 3}$$

Upon determining the ideality factor n, Equation 3 can be manipulated to solve for the temperature T as follows:

$$T = \frac{q}{nk}\left\{\frac{(ID3-ID1)(VD3-VD2)-(ID3-ID2)(VD3-VD1)}{(ID3-ID1)\ln(ID3-ID1)-(ID3-ID2)\ln(ID3-ID1)}\right\} \quad \text{Equation 4}$$

Accordingly, the temperature T can correspond to the internal temperature of the IC device 200, such as determined during the test mode to obtain the nominal internal temperature and/or to determine when the IC device 200 achieves the desired testing temperature.

Upon implementing the calculation of the temperature T as provided by Equation 4, the circuit test fixture 112 can internally heat the IC device 200 to the desired testing temperature to facilitate performance of the function measurements of the IC device 200 at the testing temperature. To heat the internal temperature of the IC device 200 greater than a maximum temperature provided by the circuit test fixture 112 (e.g., via the temperature controller 118), the power transistor 202 can be activated at full load, such that the current flowing through the power transistor 202 can heat the silicon of the IC device 200. While the power transistor is activated and the internal temperature of the IC device 200 is increasing, the circuit test fixture 112 can periodically measure the internal temperature of the IC device 200, as described above using Equation 4. Therefore, the circuit test fixture 112 can determine when the IC device 200 achieves an internal temperature that is approximately equal to the desired testing temperature. In response to determining that the internal temperature of the IC device 200 is approximately equal to the desired testing temperature, the power transistor 202 can be deactivated to facilitate functional measurements of the IC device 200 at the desired testing temperature via the circuit test fixture 112. Accordingly, the functional operation of the IC device 200 can be accurately tested and validated at the desired testing temperature.

Figure 3:
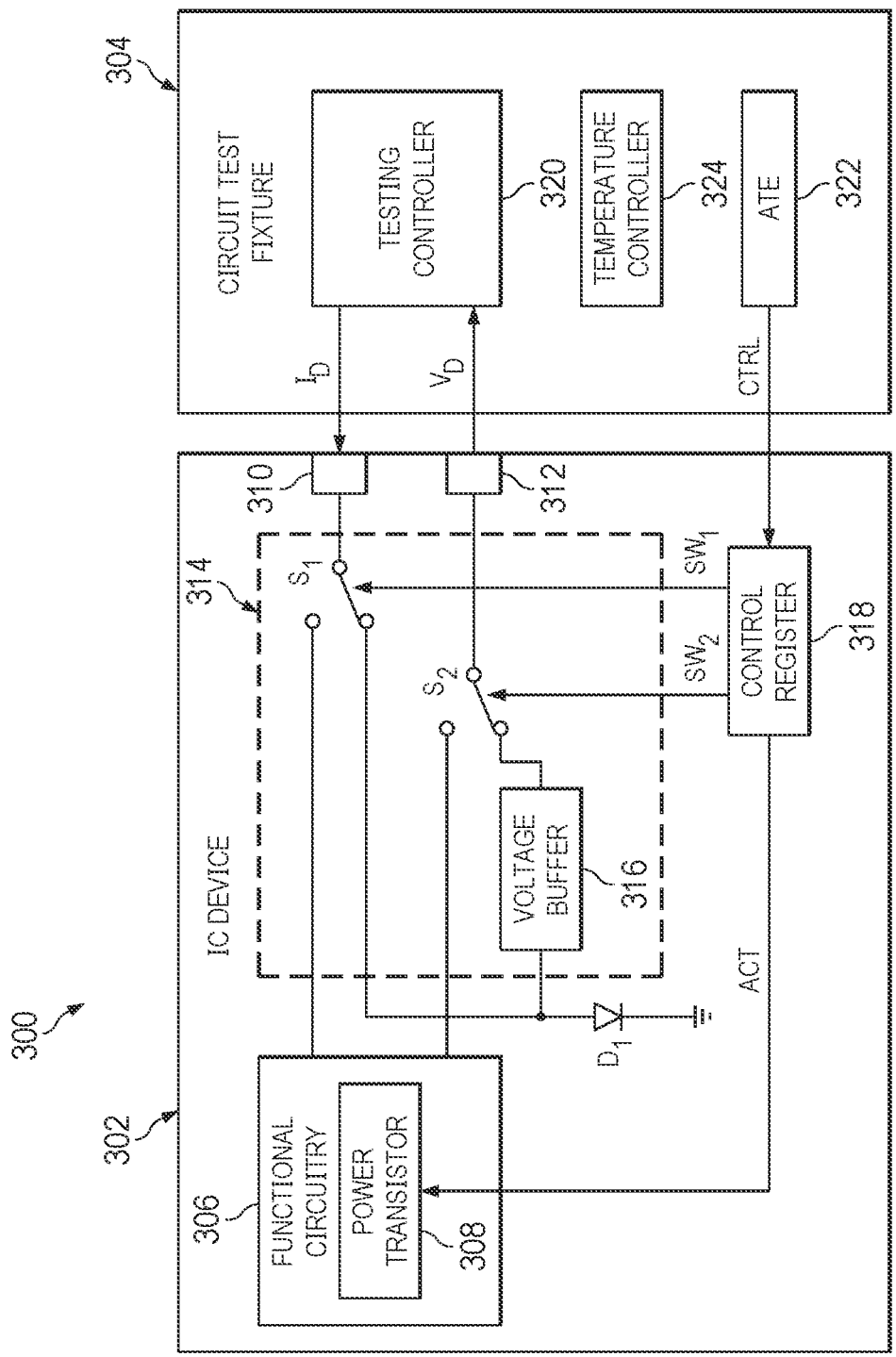
FIG. 3 is an example diagram of testing an IC device at a testing temperature.

FIG. 3 is an example diagram 300 of testing an IC device at a testing temperature. The diagram 300 includes an IC device 302 that can correspond to the IC device 102/DUT 114 in the example of FIG. 1 and the IC device 200 in the example of FIG. 2 The diagram 300 also includes a circuit test fixture 304 that can correspond to the circuit test fixture 112 in the example of FIG. 1. Therefore, reference is to be made to the examples of FIGS. 1 and 2 in the following description of the example of FIG. 3.

The IC device 302 includes functional circuitry 306 that is configured to implement the intended functions of the IC device 302. In the example of FIG. 3, the functional circuitry 306 includes a power transistor 308, such as included in a switching voltage regulator, that is configured to conduct a current when activated. The IC device 302 also includes a first conductive I/O lead 310 and a second conductive I/O lead 312. In the example of FIG. 3, the conductive I/O leads 310 and 312 can correspond to conductive pins on the IC device 302. The IC device 302 also includes a temperature test switch system 314 and a thermal diode D1. In the example of FIG. 3, the thermal diode D1 is demonstrated such that the cathode is coupled to ground.

As described above, the temperature test switch system 314 can be switched to a normal operating mode in which the functional circuitry 306 operates with the intended functions of the IC device 302, including receiving inputs and/or providing outputs via the conductive I/O leads 310 and 312. As also described above, the temperature test switch system 314 can be switched to a test mode in which the conductive I/O leads 310 and 312 are coupled to the thermal diode D1 to facilitate a single-ended Kelvin measurement of an internal temperature of the IC device 302 at the anode of the thermal diode $D_1$.

In the example of FIG. 3, the temperature test switch system 314 includes a first switch $S_1$ and a second switch $S_2$, and further includes a voltage buffer 316. The first switch $S_1$ is coupled to the first conductive I/O lead 310, and can couple to either the functional circuitry 306 in a first state or an anode of the thermal diode D1 in a second state. Therefore, when the first switch $S_1$ is in the first state, the functional circuitry 306 is coupled to the first conductive I/O lead 310, and when the first switch $S_1$ is in the second state, the thermal diode $D_1$ is coupled to the first conductive I/O lead 310. The second switch $S_2$ is coupled to the second conductive I/O lead 312, and can couple to either the functional circuitry 306 in a first state or to the anode of the thermal diode D1 via the voltage buffer 316 in a second state. Therefore, when the second switch $S_2$ is in the first state, the functional circuitry 306 is coupled to the second conductive I/O lead 312, and when the second switch $S_2$ is in the second state, the thermal diode $D_1$ is coupled to the second conductive I/O lead 312 via the voltage buffer 316. The state of the switches $S_1$ and $S_2$ is therefore demonstrated in the example of FIG. 3 as being in the test mode.

The IC device 302 also includes a control register 318. The control register 318 is configured to communicate with the circuit test fixture 304. In the example of FIG. 3, the control register 318 is also configured to generate a first switching signal $SW_1$ that controls the operation of the first switch $S_1$ and a second switching signal $SW_2$ that controls the operation of the second switch $S_2$. The control register 318 is also demonstrated as providing an activation signal ACT to the power transistor 308. Therefore, the activation signal ACT can selectively activate/deactivate the power transistor 308.

The circuit test fixture 304 includes a testing controller 320, ATE 322, and a temperature controller 324. While the testing controller 320 and the ATE 322 are demonstrated as separate components, the testing controller 320 can be implemented as a part of the ATE 322, as an example. After fabrication, the IC device 302 is coupled to the circuit test fixture 304 by coupling probes of the circuit test fixture 304 (not shown) to the first conductive I/O lead 310 and the second conductive I/O lead 312. The ATE 322 can also be communicatively coupled to the control register 318. The ATE 322 can thus set the IC device 302 to the test mode by providing a control signal CTRL to the control register 318. In response, the control register 318 can provide the switching signals $SW_1$ and $SW_2$ to control the respective switches $S_1$ and $S_2$ to the corresponding states for the test mode (as demonstrated in the example of FIG. 3). Therefore, the functional circuitry 306 is decoupled from the conductive I/O leads 310 and 312, the first conductive I/O lead 310 is coupled to the thermal diode $D_1$, and the second conductive I/O lead 312 is coupled to the thermal diode $D_1$ via the voltage buffer 316.

To measure the internal temperature of the IC device 302, the testing controller 320 can thus provide a test current $I_D$ to the first conductive I/O lead 310. The test current $I_D$ is thus provided through the thermal diode $D_1$ to ground. The testing controller 320 can thus measure a voltage VD across the thermal diode $D_1$ at the second conductive I/O lead 312. As an example, the voltage buffer 316 can provide a stable indication of the voltage VD across the thermal diode $D_1$, such as to mitigate noise and/or parasitic effects (e.g., such as from long leads of the probes that couple the IC device 302 to the circuit test fixture 304). As described above in the example of FIG. 2, the test current $I_D$ can be provided three separate times at three respective separate amplitudes (e.g., $I_{D1}$, $I_{D2}$, and $I_{D3}$). Therefore, the voltage across the thermal diode $D_1$ can be measured at three respective amplitudes (e.g., $V_{D1}$, $V_{D2}$, and $V_{D3}$) for each of the separate amplitudes of the test current, such as to satisfy the three variable solution for Equation 4 above. Accordingly, the internal temperature of the IC device 302 can be measured.

The manner of measuring the internal temperature of the IC device 302 described above can be implemented first for determining a nominal internal temperature of the IC device 302. Upon determining the nominal temperature of the IC device 302, the circuit test fixture 304 can internally heat the IC device 302 to the desired testing temperature to facilitate performance of the function measurements of the IC device 302 at the desired testing temperature. The temperature controller 324 can provide a maximum temperature during the test mode (before or after the calculation of the nominal internal temperature of the IC device 302) to heat the IC device 302 as much as possible to minimize a time of additional heating. Additionally, the ATE 322 can provide the control signal CTRL to facilitate activation of the power transistor 308 at full load via the activation signal ACT provided by the control register 318. Therefore, the current flowing through the power transistor 308 can further heat the silicon of the IC device 302. While the power transistor 308 is activated and the internal temperature of the IC device 302 is increasing, the testing controller 320 can periodically measure the internal temperature of the IC device 302, as described above. Therefore, the testing controller 320 can determine when the IC device 302 achieves an internal temperature that is approximately equal to the desired testing temperature. In response to determining that the internal temperature of the IC device 302 is approximately equal to the desired testing temperature, the ATE 322 and control register 318 can deactivate the power transistor 308 of the IC device 302, and the circuit test fixture 304 can perform the functional measurements of the IC device 302 at the desired testing temperature. Accordingly, the functional operation of the IC device 302 can be accurately tested and validated at the desired testing temperature.

Figure 4:
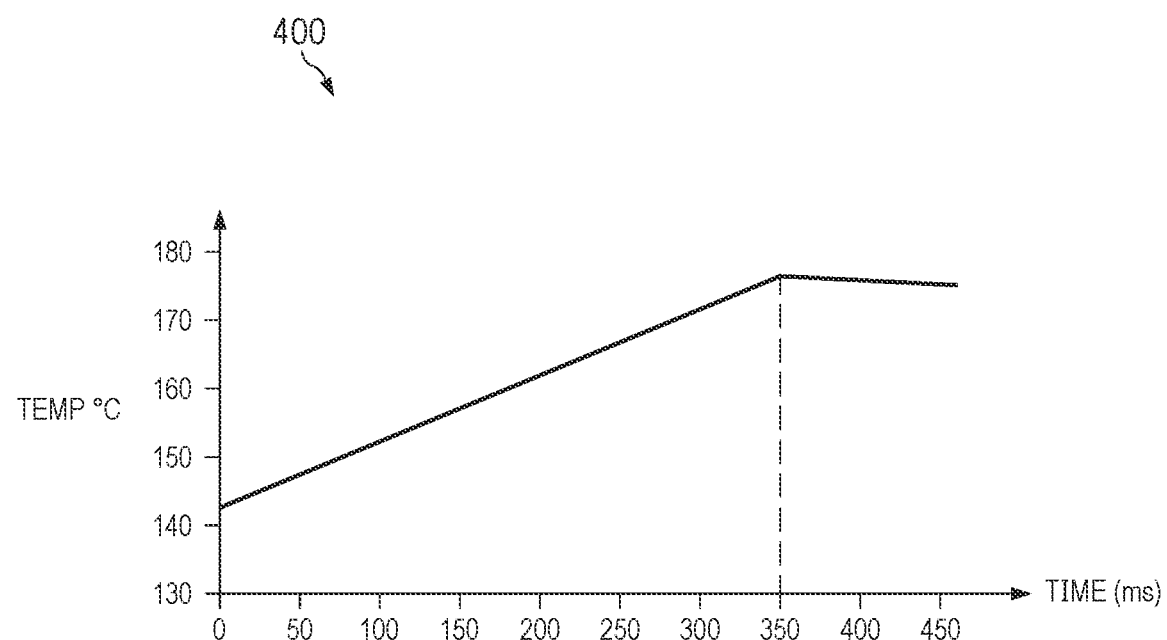
FIG. 4 is an example of a timing diagram.

FIG. 4 is an example of a timing diagram 400. The timing diagram 400 is demonstrated in the example of FIG. 3 as plotting internal temperature (in degrees Celsius) of the IC device 302 over time (in milliseconds). Therefore, reference is to be made to the example of FIG. 3 in the following description of the example of FIG. 4.

The timing diagram 400 begins with activation of the power transistor 308. At 0 milliseconds, the internal temperature is demonstrated at approximately 143° C., such as based on the maximum temperature being provided by the temperature controller 324 (e.g., 150° C. adjusted by heat sink provided by components of the IC device 302 and/or the circuit test fixture 304). Therefore, in response to activation of the power transistor 308, the internal temperature of the IC device 302 increases. As described above, the testing controller 320 can periodically measure the internal temperature of the IC device 302, such as at each of 50 millisecond intervals, to determine whether the internal temperature of the IC device 302 achieves the desired testing temperature. As an example, the desired testing temperature can be approximately 175° C.

At approximately 350 milliseconds, the testing controller 320 determines that the internal temperature is approximately equal to the desired testing temperature. For example, the desired testing temperature can correspond to a threshold, such that any temperature measurement greater than the threshold can correspond to an approximation of the desired testing temperature. Thus, in the example of FIG. 4, at 350 milliseconds, the testing controller 320 determines that the internal temperature of the IC device 302 is equal to approximately 177° C., and therefore approximately equal to the desired testing temperature. In response, the ATE 322 can provide the control signal CTRL to the control register 318 to command the control register 318 to deactivate the power transistor 308 via the activation signal ACT. Accordingly, the circuit test fixture 304 can begin performing functional measurements of the IC device 302 at the desired testing temperature beginning at 350 milliseconds.

In the example of FIG. 4, the internal temperature of the IC device 302 begins to decrease after deactivation of the power transistor 308. It is possible that the functional testing of the IC device 302 cannot be completed in sufficient time to maintain the approximate desired testing temperature. Therefore, the testing controller 320 can continue to monitor the internal temperature of the IC device 302, such as to ensure that the functional measurements are all performed at approximately the desired testing temperature.

Figure 5:
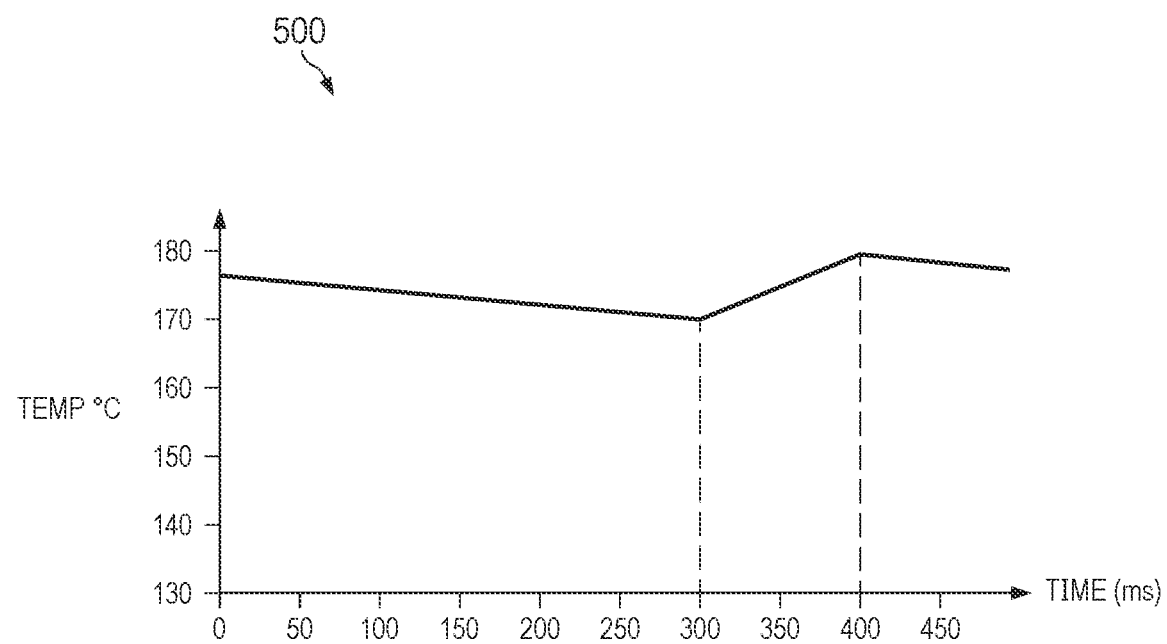
FIG. 5 is another example of a timing diagram.

FIG. 5 is another example of a timing diagram 500. The timing diagram 500 is demonstrated in the example of FIG. 3 as plotting internal temperature (in degrees Celsius) of the IC device 302 over time (in milliseconds). Therefore, reference is to be made to the examples of FIGS. 3 and 4 in the following description of the example of FIG. 5.

The timing diagram 500 begins with deactivation of the power transistor 308, and thus coincides with the 350 millisecond time of the timing diagram 400 in the example of FIG. 4. Therefore, at 0 milliseconds, the internal temperature is demonstrated at approximately 177° C. Therefore, in response to deactivation of the power transistor 308, the internal temperature of the IC device 302 decreases. As described above, the testing controller 320 can continue to periodically measure the internal temperature of the IC device 302, such as at each of 50 millisecond intervals, to determine whether the internal temperature of the IC device 302 decreases to a temperature that can no longer be considered with the desired testing temperature. As an example, the testing controller 320 can set a low temperature threshold below which the internal temperature of the IC device 302 is no longer considered the desired testing temperature. For example, the low threshold can be set at approximately 170° C.

At approximately 300 milliseconds, the testing controller 320 determines that the internal temperature is approximately equal to 170° C. Thus, in the example of FIG. 5, at 300 milliseconds, the testing controller 320 determines that the internal temperature of the IC device 302 is equal to approximately the low temperature threshold. In response, the circuit test fixture 304 can suspend the functional measurements of the IC device 302 based on subsequent functional measurements no longer being valid at the desired testing temperature. Additionally, the ATE 322 can provide the control signal CTRL to the control register 318 to command the control register 318 to reactivate the power transistor 308 via the activation signal ACT. Therefore, in response to reactivation of the power transistor 308, the internal temperature of the IC device 302 again increases.

In the example of FIG. 5, at approximately 400 milliseconds, the testing controller 320 determines that the internal temperature of the IC device 302 is equal to approximately 179° C., and therefore again approximately equal to the desired testing temperature. In response, the ATE 322 can again provide the control signal CTRL to the control register 318 to command the control register 318 to deactivate the power transistor 308 via the activation signal ACT. Accordingly, the circuit test fixture 304 can resume performing functional measurements of the IC device 302 at the desired testing temperature beginning at 400 milliseconds. Accordingly, the circuit test fixture 304 can perform all of the functional measurements of the IC device 302 at the desired testing temperature, regardless of the duration of time of the functional measurements and the rate at which the IC device 302 cools.

The IC device (e.g., the IC devices 200 and 302) are described herein as including only a single thermal diode that is dedicated for measuring the internal temperature of the IC device. However, as another example, the thermal diode can be any of a variety of diodes that are included in the functional circuitry, such as being implemented for other purposes. As another example, while the thermal diode $D_1$ is demonstrated as having a cathode coupled to ground, the thermal diode can instead have a cathode coupled to other circuitry, as an example. In this example, the temperature test switch system 314 can be coupled to an additional conductive I/O lead of the IC device 302, such that the current $I_D$ can be provided via one conducti I/O lead of the IC device 302, and the voltage VD across the thermal diode can be measured via two additional separate respective conductive I/O leads to provide a full Kelvin measurement of the temperature.

Figure 6:
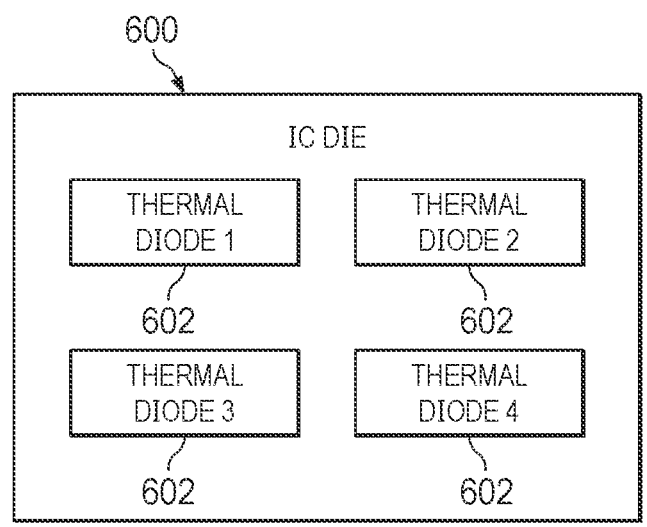
FIG. 6 is an example block diagram of an IC device die.

Furthermore, as another example, the IC device can include multiple thermal diodes distributed about the IC die of the IC device. FIG. 6 is an example block diagram of an IC device die 600. The IC device die 600 demonstrates a plan view of the die of an IC device (e.g., the IC devices 200 and 302). The IC device die 600 includes a plurality of thermal diodes 602, demonstrated in the example of FIG. 6 as four thermal diodes 602. Each of the thermal diodes 602 can be coupled to separate sets of conductive I/O leads in the test mode by a temperature test switch system, or to the same sets of conductive I/O leads in the test mode by the temperature test switch system. Therefore, the testing controller of an associated circuit test fixture can determine the internal temperature of the IC device die 600 based on each of the thermal diodes 602. For example, the testing controller can determine that the internal temperature of the IC device die 600 is at the desired testing temperature only if the temperature as measured at each of the thermal diodes is at the desired testing temperature. As another example, the testing controller can determine that the internal temperature of the IC device die 600 is at the desired testing temperature based on a statistical aggregation of the measured temperatures of each of the thermal diodes (e.g., an average) being at the desired testing temperature. Accordingly, by implementing multiple thermal diodes, the testing controller can determine that the temperature across the IC device die 600 is uniform for purposes of determining if the IC device die 600 is at the desired testing temperature.

Figure 7:
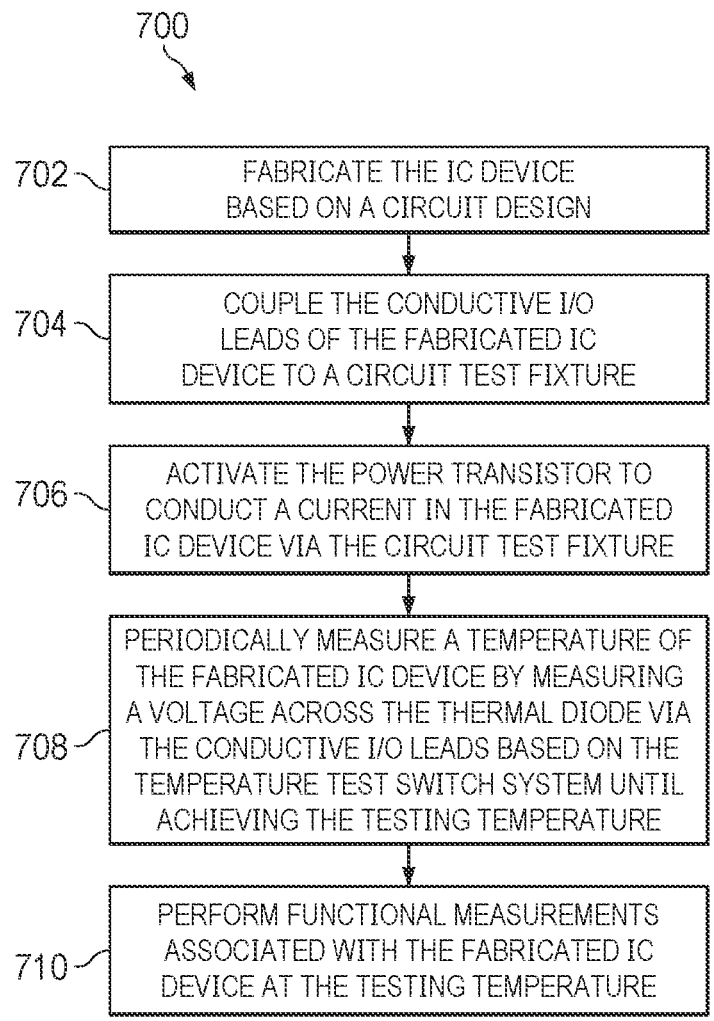
FIG. 7 is an example of a method for testing an IC device.

In view of the foregoing structural and functional features described above, an example method will be better appreciated with reference to FIG. 7. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured in an integrated circuit, processor, or a controller, for example.

FIG. 7 illustrates an example of a method 700 for testing an integrated circuit (IC) device (e.g., the IC device 102) at a testing temperature. At 702, the IC device is fabricated based on a circuit design (e.g., the circuit design 106). The fabricated IC device includes a power transistor (e.g., the power transistor 202), conductive input/output (I/O) leads (the conductive I/O leads (204 and 206), a temperature test switch system (e.g., the temperature test switch system 208) coupled between the conductive I/O leads, and a thermal diode (e.g., the thermal diode 212) coupled to the temperature test switch system. At 704, the conductive I/O leads of the fabricated IC device are coupled to a circuit test fixture (e.g., the circuit test fixture 112). At 706, the power transistor is activated to conduct a current in the fabricated IC device via the circuit test fixture. At 708, a temperature of the fabricated IC device is periodically measured by measuring a voltage across the thermal diode via the conductive I/O leads based on the temperature test switch system until achieving the testing temperature. At 710, functional measurements associated with the fabricated IC device are performed at the testing temperature.

In this description, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

The techniques described in this disclosure may also be embodied or encoded in an article of manufacture including a non-transitory computer-readable storage medium. Example non-transitory computer-readable storage media may include random access memory (RAM), read-only memory (ROM), programmable ROM, erasable programmable ROM, electronically erasable programmable ROM, flash memory, a solid-state drive, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

Modifications are possible in the described embodiments, and other embodiments are possible, within the scope of the claims.

What is claimed is:

1. A method for testing an integrated circuit (IC) device at a testing temperature, the method comprising:
    fabricating the IC device based on a circuit design, the fabricated IC device comprising a power transistor, conductive input/output (I/O) leads, a temperature test switch system coupled between the conductive I/O leads, and a thermal diode coupled to the temperature test switch system;
    coupling the conductive I/O leads of the fabricated IC device to a circuit test fixture;
    activating the power transistor to conduct a current in the fabricated IC device via the circuit test fixture;
    periodically measuring a temperature of the fabricated IC device by measuring a voltage across the thermal diode via the conductive I/O leads based on the temperature test switch system until achieving the testing temperature; and
    performing functional measurements associated with the fabricated IC device at the testing temperature.

2. The method of claim 1, further comprising measuring a nominal temperature of the fabricated IC device by measuring the voltage across the thermal diode via the conductive I/O leads based on the temperature test switch system prior to activating the power transistor.

3. The method of claim 1, wherein periodically measuring the temperature comprises:
    providing a test current from the circuit test fixture to the thermal diode via a first one of the conductive I/O leads and the temperature test switch system; and
    measuring the voltage across the thermal diode via a second one of the conductive I/O leads and the temperature test switch system.

4. The method of claim 1, wherein the temperature test switch system comprises a voltage buffer coupled to the thermal diode, wherein periodically measuring the temperature comprises periodically measuring a buffered voltage corresponding to the voltage across the thermal diode.

5. The method of claim 1, wherein the fabricated IC device comprises a plurality of thermal diodes each coupled to one of separate sets of conductive I/O leads in the TEST mode by a temperature test switch system and the same set of conductive I/O leads in the TEST mode by the temperature test switch system, wherein periodically measuring the temperature of the fabricated IC device comprises periodically measuring the temperature of the fabricated IC device by measuring a voltage across each of the thermal diodes until achieving the testing temperature at at least one of the thermal diodes.

6. The method of claim 1, wherein the circuit test fixture comprises a temperature controller configured to generate an ambient handler temperature during the testing, wherein the ambient handler temperature has a maximum handler temperature that is less than the testing temperature.

7. The method of claim 6, wherein the testing temperature is at least 25° C. greater than the maximum handler temperature.

8. The method of claim 1, wherein performing the functional measurements comprises:
    deactivating the power transistor before performing the functional measurements;
    periodically measuring the temperature of the fabricated IC device while performing the functional measurements by measuring the voltage across the thermal diode via the conductive I/O leads based on the temperature test switch system until the temperature of the fabricated IC device decreases less than the testing temperature; and
    suspending the functional measurements in response to the temperature of the fabricated IC device decreasing less than the testing temperature.

9. The method of claim 8, further comprising:
    reactivating the power transistor to conduct the current in the fabricated IC device via the circuit test fixture in response to suspending the functional measurements;
    periodically measuring the temperature of the fabricated IC device by measuring the voltage across the thermal diode via the conductive I/O leads based on the temperature test switch system until achieving the testing temperature; and
    resuming the functional measurements associated with the fabricated IC device at the testing temperature.

10. The method of claim 1, wherein the temperature test switch system comprises:
    a first switch configured to couple a first one of the conductive I/O leads to functional circuitry of the fabricated IC device in a normal operating mode and to the thermal diode in a test mode; and
    a second switch configured to couple a second one of the conductive I/O leads to the functional circuitry of the fabricated IC device in the normal operating mode and to the thermal diode in the test mode.

11. An integrated circuit (IC) comprising:
    functional circuitry comprising a power transistor;

a first conductive I/O lead;
a second conductive I/O lead;
a temperature test switch system comprising a set of switches coupled to the functional circuitry and to the first and second conductive I/O leads;
a control register that is adapted to be coupled to automated testing equipment (ATE) to control the set of switches between a normal operating mode and a test mode; and
a thermal diode coupled to the temperature test switch system, such that the thermal diode is coupled to the first and second conductive I/O leads in the test mode.

12. The IC device of claim 11, wherein the temperature test switch system comprises:
a first switch configured to couple the first conductive I/O lead to the functional circuitry in the normal operating mode and to the thermal diode in the test mode; and
a second switch configured to couple the second conductive I/O lead to the functional circuitry in the normal operating mode and to the thermal diode in the test mode.

13. The IC device of claim 12, wherein the control register is configured to provide a first switching signal to set the first switch to couple the first conductive I/O lead to the functional circuitry in the normal operating mode and to the thermal diode in the test mode, and a second switching signal to set the second switch to couple the second conductive I/O lead to the functional circuitry in the normal operating mode and to the thermal diode in the test mode.

14. The IC device of claim 11, wherein the temperature test switch system comprises a voltage buffer coupled to the second conductive I/O lead, such that the voltage buffer is configured to provide a buffered thermal voltage associated with the thermal diode in response to a test current provided through the thermal diode.

15. The IC device of claim 11, wherein the IC device comprises a plurality of thermal diodes distributed about a die area of the IC device.

16. A circuit test fixture system for testing an integrated circuit (IC) device at a testing temperature, the system comprising:
automated testing equipment (ATE) configured to communicate with a control register of the fabricated IC device to control a set of switches of a temperature test switch system of the fabricated IC device from a normal operating mode to a test mode and to activate a power transistor associated with the fabricated IC device to conduct a current in the fabricated IC device; and
a testing controller adapted to be coupled to a first conductive I/O lead of the fabricated IC device and configured to provide a test current to a thermal diode of the fabricated IC device, and adapted to be coupled to a second conductive I/O lead of the fabricated IC device to measure a voltage across the thermal diode to periodically measure a temperature of the fabricated IC device until achieving the testing temperature, the testing controller being further configured to perform functional measurements associated with the fabricated IC device at the testing temperature.

17. The system of claim 16, wherein the testing controller is configured to measure a nominal temperature of the fabricated IC device by measuring the voltage across the thermal diode via the second conductive I/O lead prior to activating the power transistor.

18. The system of claim 16, further comprising a temperature controller configured to generate an ambient handler temperature during the testing, wherein the testing temperature is at least 25° C. greater than a maximum of the ambient handler temperature.

19. The system of claim 16, wherein the testing controller is configured to:
deactivate the power transistor before performing the functional measurements at the testing temperature;
periodically measure the temperature of the fabricated IC device while performing the functional measurements by measuring the voltage across the thermal diode at the second conductive I/O lead until the temperature of the fabricated IC device decreases less than the testing temperature; and
suspend the functional measurements in response to the temperature of the fabricated IC device decreasing less than the testing temperature.

20. The system of claim 19, wherein the testing controller is further configured to:
reactivate the power transistor to conduct the current in the fabricated IC device via the circuit test fixture system in response to suspending the functional measurements;
periodically measure the temperature of the fabricated IC device by measuring the voltage across the thermal diode at the second conductive I/O lead until achieving the testing temperature; and
resume the functional measurements associated with the fabricated IC device at the testing temperature.

* * * * *